United States Patent [19]

Srivastava

[11] 4,321,488
[45] Mar. 23, 1982

[54] SAMPLE AND HOLD DETECTOR

[75] Inventor: Gopal K. Srivastava, Mt. Prospect, Ill.

[73] Assignee: Zenith Radio Corporation, Glenview, Ill.

[21] Appl. No.: 99,371

[22] Filed: Dec. 3, 1979

[51] Int. Cl.³ ............................................. G11C 27/02
[52] U.S. Cl. ................................... 307/353; 307/351; 307/358; 328/151
[58] Field of Search ............... 307/351, 352, 353, 358, 307/359; 328/151

[56] References Cited

U.S. PATENT DOCUMENTS 3,573,822  4/1971  Kennedy ........................ 307/350 X
3,702,942  11/1972  Aguirre ................................ 307/352

Primary Examiner—John Zazworsky
Attorney, Agent, or Firm—John H. Coult; Jack Kail

[57] ABSTRACT

A sample and hold detector is described which preferably includes a differential amplifier, a current mirror and a storage capacitor which is charged and discharged to the voltage level of an electrical input signal during appropriate sampling intervals. The differential amplifier receives the electrical input signal as one input and the capacitor voltage as a second input for generating, at first and second differential amplifier output ports, currents which are a function of the voltage difference between its inputs. To charge and discharge the capacitor, the latter is coupled to the differential amplifier's second output port via a current path, and the current mirror is coupled between the output ports of the differential amplifier for sourcing to the second output port a predetermined percentage of differential amplifier current generated at the first output port. The coupling among the current mirror, the differential amplifier and the capacitor is such that, when the signal input voltage exceeds the capacitor voltage, the current mirror charges the capacitor until the differential amplifier reaches equilibrium. At that point the capacitor voltage is a predetermined percentage of the signal input voltage. When the capacitor voltage exceeds the signal input voltage, the differential amplifier discharges the capacitor via the current path and the second output port until the capacitor voltage is a predetermined percentage of the signal input voltage, whereupon the differential amplifier's second output port receives all its current from the current mirror to the exclusion of discharge current from the capacitor. Hence, further discharge of the capacitor is precluded.

7 Claims, 2 Drawing Figures

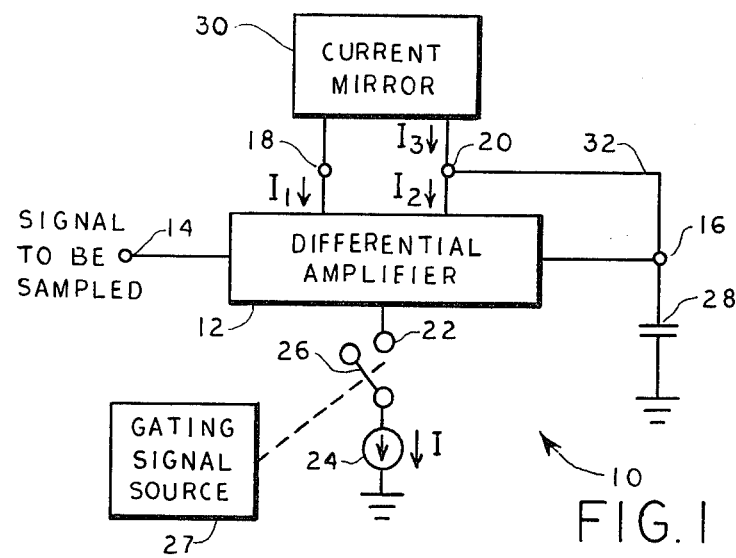
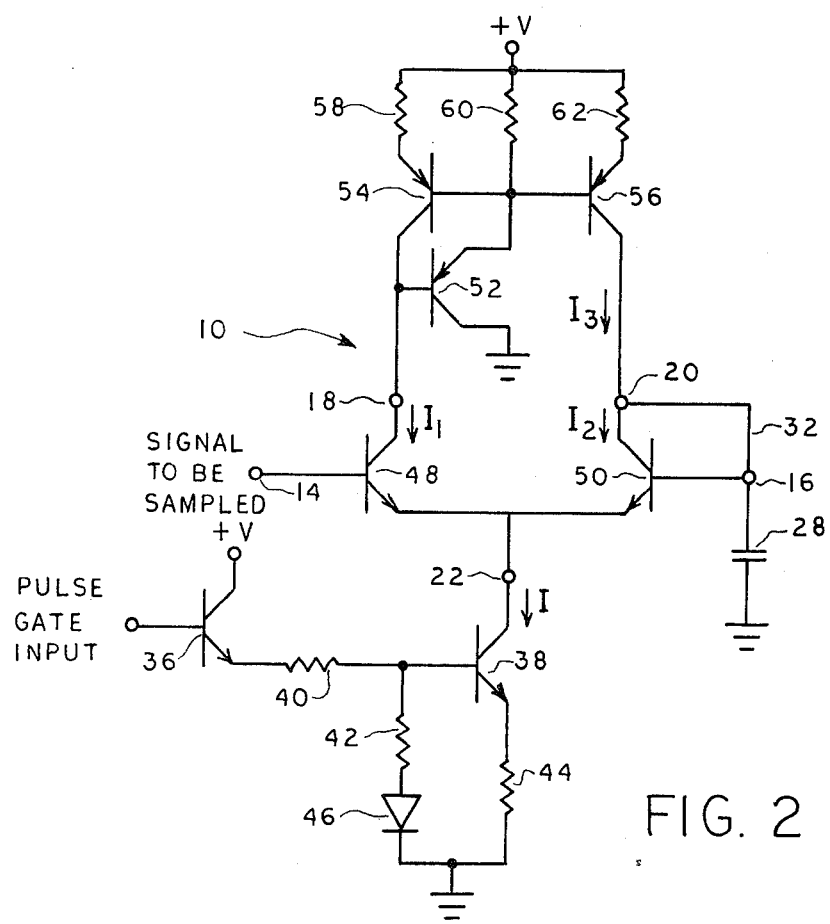

SAMPLE AND HOLD DETECTOR

BACKGROUND OF THE INVENTION

The invention is directed to improvements in detectors which sample the peak magnitude of an electrical input signal and store the sampled magnitude for further use. Such detectors are usually referred to as "sample and hold" or "peak" detectors.

One of the simplest forms of peak detectors includes a diode for receiving the electrical input signal and for driving a capacitor which stores the peak value of the input signal. Variations of such schemes may include replacing the diode with a transistor which may be turned off and on at appropriate intervals for sampling a selected portion of the input signal.

The above-mentioned types of detectors suffer from several problems, one of which is the inability of the capacitor to store a voltage which is nearly exactly equal in amplitude to the peak voltage associated with the electrical input signal. For example, where the peak detector includes the transistor-capacitor combination, the voltage stored on the capacitor is invariably lower than the voltage of the input signal which is applied to the base of the transistor because of the transistor's base-emitter voltage drop. In some applications, the base-emitter voltage difference between the capacitor voltage and the voltage associated with the sampled signal is significant and undesirable.

The base-emitter voltage difference referred to above also gives rise to another problem due to the fact that, as the temperature of the transistor changes, its base-emitter voltage also changes. Hence, the capacitor voltage also varies as a function of temperature even though the voltage associated with the input signal may remain constant. Accordingly, the sampling voltage on the capacitor does not track with the input signal as temperature changes.

The conventional peak detector described above also suffers from the fact that its stored voltage varies with sampling time. This result occurs because the forward resistance of the base-emitter junction of the transistor (or diode) used as a peak detector varies as a function of the voltage across that junction. Therefore, as the capacitor charges and its voltage approaches the peak voltage of input signal, the forward resistance of the junction increases, thereby reducing the capacitor's rate of charge. Hence, the voltage on the capacitor only approaches, but never reaches, the peak amplitude of the input signal. The stored voltage on the capacitor is, therefore, a function of the sampling time. For applications where a very short sampling time is necessary, the conventional peak detector is very inefficient and inaccurate.

Yet another problem which arises with conventional detectors is their susceptibility to noise. Specifically, if the input signal includes random noise, the voltage on the capacitor may rise to the peak value of the noise. Clearly, it is preferable for the capacitor voltage to be less sensitive to such noise.

For reasons set forth above, prior detectors have been less than satisfactory for a variety of applications, particularly applications in which the capacitor voltage is required to very accurately correspond to and track with the voltage associated with the sampled signal.

OBJECTS OF THE INVENTION

It is a general object of the invention to provide an improved sample and hold detector.

It is a more specific object of the invention to provide a sample and hold detector having a storage capacitor which is driven to voltage which is substantially equal to a selected percentage of the voltage associated with an input signal to be sampled.

It is another object of the invention to provide a sample and hold detector for developing a detected voltage whose value is not substantially affected by temperature changes, by symmetrical noise in the sampled signal, or by the sampling time as long as the sampling time is smaller or equal to the desired period of the signal to be sampled.

BRIEF DESCRIPTION OF THE DRAWINGS

The objects stated above and other objects of the invention are set forth more particularly in the following detailed description and in the accompanying drawings of which:

FIG. 1 depicts, in block diagram form, a detector in accordance with the invention; and FIG. 2 is a detailed circuit diagram of a preferred embodiment of the detector shown in FIG. 1.

DESCRIPTION OF THE PREFERRED EMBODIMENT

The sample and hold detector described herein takes advantage of the operating characteristics of a differential amplifier and a current mirror both of which are interconnected with a storage capacitor in a novel arrangement which provides superior signal detection. The diagrammatic view shown in FIG. 1 illustrates the general nature of such an arrangement.

As shown, the detector 10 includes a differential amplifier 12 which has first and second signal input ports 14, 16, first and second current output ports 18, 20, and a port 22 for receiving an operating current I from a current source 24. The differential amplifier may be turned off and on by gating means shown as a switch 26 which alternately connects and disconnects the current source 24 from the differential amplifier 12. The switch 26 is preferably operated by a gating signal provided by a source 27. By way of illustration, the source 27 may provide a pulse gate output for closing and opening the switch 26 at the desired sampling rate.

The signal which is to be sampled is applied to the first signal input port 14. The second signal input port 16 is coupled to one terminal of a storage capacitor 28, the other terminal of which may be grounded. Suffice it to say at this juncture that the detector 10 operates to charge or discharge the capacitor 28 such that the voltage at the port 16 rapidly becomes a predetermined percentage of the voltage which is sensed at the port 14. In the preferred case, the capacitor 28 charges or discharges to substantially 100 percent of the voltage at port 14, although other predetermined percentages may be selected by design as described hereinafter. Thus, the voltage across the capacitor 28 may be a replica of the instantaneous peak voltage presented to the port 14 and is stored on the capacitor 28 for any further use desired.

In the process of charging or discharging the capacitor 28, the differential amplifier 12 is responsive to a difference in the voltages at ports 14 and 16 for developing at its output ports 18 and 20 currents $I_1$ and $I_2$ which are a function of that difference. In the case where the voltage across the capacitor 28 is equal to the signal voltage at the port 14, the currents $I_1$ and $I_2$ reach an equilibrium point at which they are equal to each other.

Coupled to the output port 18 and 20 and to the capacitor 28 is means, preferably in the form of a current mirror 30, which is responsive to the current $I_1$ at output port 18 for sourcing to the second output port 20 a further current which is a predetermined percentage of the current $I_1$ such that, when the signal input voltage at port 14 exceeds the voltage on capacitor 28, the capacitor 28 receives that further current for charging to a predetermined percentage of the signal input voltage at port 14; the differential amplifier then sinks that further current through port 20 for holding constant the charge on the capacitor 28. When the voltage on the capacitor exceeds the signal input voltage at port 14, the capacitor discharges into the differential amplifier via output port 20 toward a predetermined percentage of the signal input voltage until the current mirror provides the further current to the differential amplifier via port 20 to prevent further discharge of the capacitor 28.

The operation of the current mirror 30 may be further described by the following example. Assuming the voltage on the capacitor is equal to four volts and the voltage at the input port 14 is five volts when the switch 26 is closed, the current $I_1$ will initially be equal to the operating current I and the current $I_2$ will be zero. The current mirror 30 responds to the level of the current $I_1$ by "mirroring" that current toward the port 20 by developing a current $I_3$ equal to $I_1$. Initially all of the current $I_3$ flows through a current path 32 for charging the capacitor 28 toward five volts. As the voltage across the capacitor nears five volts, the current $I_1$ decreases and the differential amplifier begins to conduct a current $I_2$. When the voltage across the capacitor 28 equals five volts, all of the current $I_3$ enters the differential amplifier via the port 20 and none flows to the capacitor. The differential amplifier is now in a state of equilibrium in which its input voltages are equal and the currents $I_1$ and $I_2$ are each equal to one-half the value of the operating current I.

Conversely, when the switch 26 closes and the signal voltage at the input port 14 equals four volts, for example, and the voltage across the capacitor 28 equals five volts, the currents $I_1$ and $I_3$ initially equal zero and the current $I_2$ initially equals I. The current $I_2$ is initially drawn entirely from the capacitor 28 for discharging it toward four volts. As the capacitor voltage approaches four volts, the differential amplifier begins drawing a current $I_1$, and the current mirror supplies a corresponding current $I_3$ equal to $I_1$. At this point, the differential amplifier receives a current $I_2$ at port 20 which includes the current $I_3$ and discharge current from the capacitor 28. When the capacitor discharges to four volts, the voltages at input ports 14 and 16 are equal in magnitude, thereby forcing the differential amplifier into a state of equilibrium in which its current $I_1$ and $I_2$ are equal in magnitude. Thus, $I_1 = I_3 = I_2$ and the capacitor 28 can discharge no further.

It can be seen, therefore, that the inherent characteristic of a differential amplifier to generate currents whose relative values are a function of the different input voltages, along with the characteristic of a current mirror to respond to receipt of one current by developing another current equal in value to the received current, have been used in the illustrated arrangement to rapidly and accurately charge and discharge the storage capacitor 28.

Referring now to FIG. 2, there is shown a detailed circuit diagram of the sample and hold detector 10. In this embodiment, the functions of the signal source 27, the current source 24 and the switch 26 are provided by transistors 36 and 38, their associated resistors 40, 42 and 44, and a diode 46. In operation, the transistor 36 receives a pulse gate at its base for turning on the transistor 38, the latter of which develops the operating current I. When the pulse gate terminates, the transistor 36 turns off for turning off the transistor 38 and discontinuing the supply of operating current. The diode 46 provides temperature compensation for the current I.

The differential amplifier 12 includes emitter-coupled transistors 48 and 50 whose common emitter terminal receives the current I via the port 22. The base of the transistor 48 receives the signal to be sampled at input port 14 and the base of the transistor 50 is coupled to the capacitor 28 at port 16.

The collectors of the transistors 48 and 50 are coupled via the output ports 18 and 20 to a current mirror comprising PNP transistors 52, 54 and 56 and their associated resistors 58, 60 and 62.

The operation of the detector of FIG. 2 is the same as described above with reference to FIG. 1. Specifically, when the transistor 38 generates the current I, and when the voltage at port 14 exceeds the voltage at port 16 by more than 120 mv, the transistor 48 develops a current $I_1$ which is approximately equal to I, the current $I_2$ being zero. The transistor 52 operates essentially as an emitter follower and the transistor 54 generates a collector current which is substantially equal to $I_1$.

Because the transistors 54 and 56 and their respective emitter resistors 58 and 62 are matched, the transistor 56 responds to the operating condition of the transistor 54 by developing a collector current $I_3$ substantially equal to $I_1$. The current $I_3$ charges the capacitor 28 via the current path 32. When the voltage across the capacitor 28 rises to within about 120 millivolts of the voltage at port 14, the transistor 50 turns on and begins drawing collector current $I_2$ from the current $I_3$, thus reducing the amount of current $I_3$ available for charging the capacitor 28. The charging of capacitor 28 continues until its voltage is equal to the voltage at port 14, whereupon the transistors 48 and 50 draw equal currents $I_1$ and $I_2$. Because the currents $I_1$, $I_2$ and $I_3$ are now all of equal magnitude, the capacitor 28 receives no current and the differential amplifier is in equilibrium. Hence, charging of the capacitor is discontinued and its voltage is equal to the voltage at port 14.

When the transistor 38 is turned on and the capacitor voltage exceeds the voltage at port 14, the transistor 50 is turned on for receiving discharge current of the capacitor 28 via the current path 32. When the capacitor discharges to within about 120 millivolts of the voltage at port 14, the transistor 48 begins conducting current $I_1$ and the current mirror generates substantially equal current $I_3$. The current $I_3$ provides a part of the current $I_2$ so that the transistor 50 sinks less discharge current from the capacitor 28. The discharge of the capacitor 28 continues until its voltage is reduced to the level of voltage at the port 14, whereupon the transistors 48 and 50 are again in a condition of equilibrium in which they conduct equal currents $I_1$ and $I_2$. Because $I_3$ equals $I_1$, the current $I_2$ received by the transistor 50 is supplied solely by the current mirror as the current $I_3$. Hence, the equilibrium condition of the transistors 48 and 50 precludes further discharge of the capacitor 28. At this point, of course, the voltages at input ports 14 and 16 are substantially equal to each other.

It will be appreciated that, for most applications of the detector 10, it is desirable that the capacitor 28 be charged or discharged such that its stored voltage becomes substantially equal to the voltage at input port 14. However, it is contemplated that situations will arise where it is desired that the capacitor 28 charge or discharge to a different percentage of the peak voltage at port 14. The detector 10 is easily adjusted for this situation by causing the current mirror to develop a current $I_3$ which is a predetermined percentage of the current $I_1$. Such an adjustment may be made, for example, by modifying the value of the resistor 62. Should the value of the resistor 62 be reduced such that the transistor 56 develops a current $I_3$ which is twice as large as the current $I_1$, then the capacitor 28 will be charged or discharged until its voltage is approximately 18 millivolts more than the voltage at port 14. At that point, the transistors 48 and 50 reach equilibrium with the current $I_2$ twice as large as the current $I_1$.

It will be appreciated that the detector 10 has several important advantages. Among those advantages is the ability of the detector to charge the storage capacitor to nearly the exact peak voltage present at the input port 14. In addition, the voltage stored in the capacitor tracks the voltage at port 14 irrespective of changes in ambient temperature. This latter advantage is due to the fact that the opposing temperature co-efficients associated with the transistors 48 and 50 cancel each other out.

The detector 10 also exhibits a decreased sensitivity to noise which is symmetrical, i.e., noise which exhibits equal positive and negative excursions. During the sampling interval (when the differential amplifier is on) the capacitor 28 charges and discharges in response to positive and negative excursions of the noise. Hence, if noise excursions occur during the sampling interval, and the positive noise excursions are equal in amplitude to the negative noise excursions, the capacitor 28 charges and discharges with each such excursion so that the net charge on the capacitor due to noise is zero.

In some applications, it is required that a number of signals be sampled and that a comparison be made between two or more of the stored samples. If one detector 10 is used for sampling each such signal, an accurate comparison between stored samples is possible for two reasons. First, the samples stored on the storage capacitors all track with one another as temperature changes for the reasons set forth above. Also, the value of each stored sample remains substantially constant because, after the sampling interval, the storage capacitor has no path to discharge. In the embodiment of FIG. 2, the transistors 50 and 56 are both off between sampling intervals, thereby isolating the stored charge on the capacitor 28.

A further advantage of the detector described herein is that the sampled voltage on the storage capacitor does not vary as a function of sampling time as long as the sampling time is smaller than or equal to the desired period of the signal to be sampled. This desirable result occurs because the storage capacitor is charged and/or discharged rapidly and at a substantially constant rate.

Although the invention has been described in terms of a preferred structure, it will be obvious to those skilled in the art that many modifications and alterations thereto may be made without departing from the invention. For example, current mirrors other than the type specifically shown in FIG. 2 may be employed to achieve the same results. In addition, various modifications may be made to the differential amplifier, such as employing PNP rather than NPN transistors. With the latter modification, the current mirror may be constructed of NPN transistors. Many variations may, of course, be made to the current source which supplies operating current to the differential amplifier. Accordingly, it is intended that all such alterations and modifications be included within the spirit and scope of the invention as defined by the appended claims.

What is claimed is:

1. A sample and hold detector for storing a voltage representative of a sampled portion of an electrical input signal, comprising:

a differential amplifier having first and second signal input ports and first and second current output ports, said differential amplifier being responsive to a difference in voltage levels between its signal input ports for developing, at its current output ports, currents which are a function of said difference;

means for coupling the input signal to the first signal input port;

a storage capacitor coupled to the second signal input port;

means for turning the differential amplifier off and on at a given sampling rate;

means defining a current path between the capacitor and the second current output port; and current mirror means coupled between the differential amplifier's output ports and responsive to differential amplifier current at the first current output port for sourcing to the second current output port a further current which is a predetermined percentage of differential amplifier current at the first current output port such that, when voltage at the first signal input port exceeds voltage stored on the capacitor, the capacitor receives the further current for charging to a predetermined percentage of the voltage at the first signal input port and the differential amplifier then sinks the further current for holding constant the charge on the capacitor and such that, when the capacitor voltage exceeds the voltage at the first signal input port, the capacitor discharges via the current path and the second current output port toward a predetermined percentage of the voltage at the first signal input port until said current mirror means provides the further current to the second current output port to prevent further discharge of the capacitor.

2. A detector as set forth in claim 1 wherein said current mirror means provides to said second current output port a further current which is substantially equal in magnitude to the differential amplifier current at said first current output port.

3. A detector as set forth in claim 1 wherein said current mirror includes a first transistor coupled to said first current output port for conducting a current substantially equal in value to the differential amplifier current at the first current output port, and a second transistor coupled to said second current output port and responsive to the operating condition of said first transistor for sourcing said further current to said second current output port.

4. A sample and hold detector for storing a voltage representative of a sampled portion of an electrical input signal, comprising:

a differential amplifier having first and second signal input ports and first and second current output ports, said differential amplifier being responsive to a difference in voltage levels between its signal input ports for developing, at its current output ports, currents which are a function of said difference, said differential amplifier including a pair of emitter-coupled transistors, one of said transistors having a base terminal coupled to the first signal input port and a collector terminal constituting the first current output port, the other of said transistors having a base terminal coupled to the second signal input port and a collector terminal constituting the second current output port;

means for coupling the input signal to the first signal input port;

a storage capacitor coupled to the second signal input port;

means for turning the differential amplifier off and on at a given sampling rate;

means defining a current path between the capacitor and the second current output port; and circuit means responsive to differential amplifier current at the first current output port for sourcing to the second current output port a further current which is a predetermined percentage of differential amplifier current at the first current output port such that, when voltage at the first signal input port exceeds voltage stored on the capacitor, the capacitor receives the further current for charging to a predetermined percentage of the voltage at the first signal input port and the differential amplifier then sinks the further current for holding constant the charge on the capacitor and such that, when the capacitor voltage exceeds the voltage at the first signal input port, the capacitor discharges via the current path and the second current output port toward a predetermined percentage of the voltage at the first signal input port until said circuit means provides the further current to the second current output port to prevent further discharge of the capacitor.

5. A sample and hold detector for storing a voltage representative of a sampled portion of an electrical input signal, comprising:

first and second emitter-coupled transistors each having a base terminal, an emitter terminal and a collector terminal;

a current source for supplying operating current at a given sampling rate to the emitter terminals of said first and second transistors;

means for coupling the input signal to the base terminal of said first transistor;

a storage capacitor coupled to the base terminal and to the collector terminal of said second transistor; and a current mirror responsive to collector current of said first transistor for sourcing a corresponding further current to the collector terminal of said second transistor such that, when the input signal voltage exceeds voltage stored on the capacitor, the capacitor receives the further current for charging to the voltage of the signal input and said second transistor then sinks the further current for holding constant the charge on the capacitor and such that, when the capacitor voltage exceeds the signal input voltage, the capacitor discharges via the collector terminal of said second transistor toward the signal input voltage until the current mirror provides the further current to the second transistor to prevent further discharge of the capacitor.

6. A detector as set forth in claim 5 wherein said current mirror includes a third transistor coupled to the collector terminal of said first transistor for conducting a current substantially equal in value to the collector current of said first transistor, and a fourth transistor coupled to the collector terminal of said second transistor and responsive to the operating condition of said third transistor for sourcing the further current to the collector terminal of said second transistor.

7. A detector as set forth in claim 6 wherein said current source includes a fifth transistor adapted to be turned off and on at the given sampling rate such that, when on, said fifth transistor supplies operating current to said first and second transistors.

* * * * *